United States Patent
Shappir et al.

(10) Patent No.: US 7,468,926 B2
(45) Date of Patent: Dec. 23, 2008

(54) PARTIAL ERASE VERIFY

(75) Inventors: Assaf Shappir, Kiryat Ono (IL); Shai Eisen, Tel Aviv (IL)

(73) Assignee: Saifun Semiconductors Ltd., Netanya (IL)

( * ) Notice: Subject to any disclaimer, the term of this patent is extended or adjusted under 35 U.S.C. 154(b) by 45 days.

(21) Appl. No.: 11/335,321

(22) Filed: Jan. 19, 2006

(65) Prior Publication Data

US 2006/0158940 A1    Jul. 20, 2006

Related U.S. Application Data

(60) Provisional application No. 60/644,569, filed on Jan. 19, 2005.

(51) Int. Cl.
*G11C 7/00* (2006.01)
(52) U.S. Cl. .................. 365/218; 365/185.19; 365/200
(58) Field of Classification Search ............ 365/185.29, 365/185.24, 218, 200, 185.19
See application file for complete search history.

(56) References Cited

U.S. PATENT DOCUMENTS

| | | | |
|---|---|---|---|
| 3,881,180 A | 4/1975 | Gosney, Jr. | |
| 3,895,360 A | 7/1975 | Cricchi et al. | |
| 3,952,325 A | 4/1976 | Beale et al. | |
| 4,016,588 A | 4/1977 | Ohya et al. | |
| 4,017,888 A | 4/1977 | Christie et al. | |
| 4,145,703 A | 3/1979 | Blanchard et al. | |
| 4,151,021 A | 4/1979 | McElroy | |
| 4,173,766 A | 11/1979 | Hayes | |
| 4,173,791 A | 11/1979 | Bell | |
| 4,247,861 A | 1/1981 | Hsu et al. | |
| 4,257,832 A | 3/1981 | Schwabe et al. | |
| 4,281,397 A | 7/1981 | Neal et al. | |
| 4,306,353 A | 12/1981 | Jacobs et al. | |
| 4,342,102 A | 7/1982 | Puar | |
| 4,342,149 A | 8/1982 | Jacobs et al. | |
| 4,360,900 A | 11/1982 | Bate | |
| 4,373,248 A | 2/1983 | McElroy | |
| 4,380,057 A | 4/1983 | Kotecha et al. | |
| 4,388,705 A | 6/1983 | Sheppard | |
| 4,389,705 A | 6/1983 | Sheppard | |
| 4,404,747 A | 9/1983 | Collins | |
| 4,435,786 A | 3/1984 | Tickle | |
| 4,448,400 A | 5/1984 | Harari | |
| 4,471,373 A | 9/1984 | Shimizu et al. | |

(Continued)

FOREIGN PATENT DOCUMENTS

EP        0 656 628        6/1995

(Continued)

OTHER PUBLICATIONS

U.S. Appl. No. 08/902,890, filed Jul. 30, 1997*, Eitan.

(Continued)

*Primary Examiner*—Pho M. Luu
(74) *Attorney, Agent, or Firm*—EMPK & Shiloh, LLP

(57) ABSTRACT

A method for erasing memory cells in a memory array, the method including applying an erase pulse to bits of a cell ensemble of a memory cell array, and performing an erase verification operation only on a subgroup of the cell ensemble being erased to check if the memory cells threshold voltage (Vt) has been lowered to an erase verify (EV) voltage level.

11 Claims, 9 Drawing Sheets

U.S. PATENT DOCUMENTS

| | | | |
|---|---|---|---|
| 4,494,016 A | 1/1985 | Ransom et al. | |
| 4,507,673 A | 3/1985 | Aoyama et al. | |
| 4,521,796 A | 6/1985 | Rajkanan et al. | |
| 4,527,257 A | 7/1985 | Cricchi | |
| 4,586,163 A | 4/1986 | Koike | |
| 4,613,956 A | 9/1986 | Paterson et al. | |
| 4,630,085 A | 12/1986 | Koyama | |
| 4,663,645 A | 5/1987 | Komori et al. | |
| 4,665,426 A | 5/1987 | Allen et al. | |
| 4,667,217 A | 5/1987 | Janning | |
| 4,672,409 A | 6/1987 | Takei et al. | |
| 4,725,984 A | 2/1988 | Ip et al. | |
| 4,733,105 A | 3/1988 | Shin et al. | |
| 4,742,491 A | 5/1988 | Liang et al. | |
| 4,758,869 A | 7/1988 | Eitan et al. | |
| 4,760,555 A | 7/1988 | Gelsomini et al. | |
| 4,761,764 A | 8/1988 | Watanabe | |
| 4,769,340 A | 9/1988 | Chang et al. | |
| 4,780,424 A | 10/1988 | Holler et al. | |
| 4,839,705 A | 6/1989 | Tigelaar et al. | |
| 4,847,808 A | 7/1989 | Kobatake | |
| 4,857,770 A | 8/1989 | Partovi et al. | |
| 4,870,470 A | 9/1989 | Bass, Jr. et al. | |
| 4,916,671 A | 4/1990 | Ichiguchi | |
| 4,941,028 A | 7/1990 | Chen et al. | |
| 4,961,010 A | 10/1990 | Davis | |
| 4,992,391 A | 2/1991 | Wang | |
| 5,021,999 A | 6/1991 | Kohda et al. | |
| 5,027,321 A | 6/1991 | Park | |
| 5,029,063 A | 7/1991 | Lingstaedt et al. | |
| 5,042,009 A | 8/1991 | Kazerounian et al. | |
| 5,075,245 A | 12/1991 | Woo et al. | |
| 5,081,371 A | 1/1992 | Wong | |
| 5,086,325 A | 2/1992 | Schumann et al. | |
| 5,094,968 A | 3/1992 | Schumann et al. | |
| 5,104,819 A | 4/1992 | Freiberger et al. | |
| 5,117,389 A | 5/1992 | Yiu | |
| 5,120,672 A | 6/1992 | Mitchell et al. | |
| 5,142,495 A | 8/1992 | Canepa | |
| 5,142,496 A | 8/1992 | Van Buskirk | |
| 5,159,570 A | 10/1992 | Mitchell et al. | |
| 5,168,334 A | 12/1992 | Mitchell et al. | |
| 5,172,338 A | 12/1992 | Mehrotra et al. | |
| 5,175,120 A | 12/1992 | Lee | |
| 5,204,835 A | 4/1993 | Eitan | |
| 5,214,303 A | 5/1993 | Aoki | |
| 5,237,213 A | 8/1993 | Tanoi | |
| 5,241,497 A | 8/1993 | Komarek | |
| 5,260,593 A | 11/1993 | Lee | |
| 5,268,861 A | 12/1993 | Hotta | |
| 5,276,646 A | 1/1994 | Kim et al. | |
| 5,280,420 A | 1/1994 | Rapp | |
| 5,289,412 A | 2/1994 | Frary et al. | |
| 5,293,563 A | 3/1994 | Ohta | |
| 5,295,092 A | 3/1994 | Hotta | |
| 5,295,108 A | 3/1994 | Higa | |
| 5,305,262 A | 4/1994 | Yoneda | |
| 5,311,049 A | 5/1994 | Tsuruta | |
| 5,315,541 A | 5/1994 | Harari et al. | |
| 5,324,675 A | 6/1994 | Hayabuchi | |
| 5,334,555 A | 8/1994 | Sugiyama et al. | |
| 5,335,198 A | 8/1994 | Van Buskirk et al. | |
| 5,338,954 A | 8/1994 | Shimoji | |
| 5,345,425 A | 9/1994 | Shikatani | |
| 5,349,221 A | 9/1994 | Shimoji | |
| 5,350,710 A | 9/1994 | Hong et al. | |
| 5,352,620 A | 10/1994 | Komori et al. | |
| 5,357,134 A | 10/1994 | Shimoji | |
| 5,359,554 A | 10/1994 | Odake et al. | |
| 5,361,343 A | 11/1994 | Kosonocky et al. | |
| 5,366,915 A | 11/1994 | Kodama | |
| 5,369,615 A * | 11/1994 | Harari et al. | 365/185.19 |
| 5,375,094 A | 12/1994 | Naruke | |
| 5,381,374 A | 1/1995 | Shiraishi et al. | |
| 5,393,701 A | 2/1995 | Ko et al. | |
| 5,394,355 A | 2/1995 | Uramoto et al. | |
| 5,399,891 A | 3/1995 | Yiu et al. | |
| 5,400,286 A * | 3/1995 | Chu et al. | 365/185.19 |
| 5,402,374 A | 3/1995 | Tsuruta et al. | |
| 5,412,601 A | 5/1995 | Sawada et al. | |
| 5,414,693 A | 5/1995 | Ma et al. | |
| 5,418,176 A | 5/1995 | Yang et al. | |
| 5,418,743 A | 5/1995 | Tomioka et al. | |
| 5,422,844 A | 6/1995 | Wolstenholme et al. | |
| 5,424,567 A | 6/1995 | Chen | |
| 5,424,978 A | 6/1995 | Wada et al. | |
| 5,426,605 A | 6/1995 | Van Berkel et al. | |
| 5,428,568 A * | 6/1995 | Kobayashi et al. | 365/185.24 |
| 5,434,825 A | 7/1995 | Harari et al. | |
| 5,436,478 A | 7/1995 | Bergemont et al. | |
| 5,436,481 A | 7/1995 | Egawa et al. | |
| 5,440,505 A | 8/1995 | Fazio et al. | |
| 5,450,341 A | 9/1995 | Sawada et al. | |
| 5,450,354 A | 9/1995 | Sawada et al. | |
| 5,455,793 A | 10/1995 | Amin et al. | |
| 5,467,308 A | 11/1995 | Chang et al. | |
| 5,477,499 A | 12/1995 | Van Buskirk et al. | |
| 5,495,440 A | 2/1996 | Asakura | |
| 5,496,753 A | 3/1996 | Sakurai et al. | |
| 5,508,968 A | 4/1996 | Collins et al. | |
| 5,518,942 A | 5/1996 | Shrivastava | |
| 5,521,870 A | 5/1996 | Ishikawa | |
| 5,523,251 A | 6/1996 | Hong | |
| 5,523,972 A | 6/1996 | Rashid et al. | |
| 5,530,803 A | 6/1996 | Chang et al. | |
| 5,534,804 A | 7/1996 | Woo | |
| 5,537,358 A | 7/1996 | Fong | |
| 5,544,116 A | 8/1996 | Chao et al. | |
| 5,553,018 A | 9/1996 | Wang et al. | |
| 5,553,030 A | 9/1996 | Tedrow et al. | |
| 5,557,221 A | 9/1996 | Taguchi et al. | |
| 5,557,570 A | 9/1996 | Iwahashi | |
| 5,559,687 A | 9/1996 | Nicollini et al. | |
| 5,563,823 A | 10/1996 | Yiu et al. | |
| 5,568,085 A | 10/1996 | Eitan et al. | |
| 5,579,199 A | 11/1996 | Kawamura et al. | |
| 5,581,252 A | 12/1996 | Thomas | |
| 5,583,808 A | 12/1996 | Brahmbhatt | |
| 5,590,068 A | 12/1996 | Bergemont | |
| 5,590,074 A | 12/1996 | Akaogi et al. | |
| 5,592,417 A | 1/1997 | Mirabel | |
| 5,596,527 A | 1/1997 | Tomioka et al. | |
| 5,599,727 A | 2/1997 | Hakozaki et al. | |
| 5,600,586 A | 2/1997 | Lee | |
| 5,606,523 A | 2/1997 | Mirabel | |
| 5,608,679 A | 3/1997 | Mi et al. | |
| 5,612,642 A | 3/1997 | McClinyock | |
| 5,617,357 A | 4/1997 | Haddad et al. | |
| 5,623,438 A | 4/1997 | Guritz et al. | |
| 5,627,790 A | 5/1997 | Golla et al. | |
| 5,633,603 A | 5/1997 | Lee | |
| 5,636,288 A | 6/1997 | Bonneville et al. | |
| 5,644,531 A | 7/1997 | Kuo et al. | |
| 5,654,568 A | 8/1997 | Nakao | |
| 5,656,513 A | 8/1997 | Wang et al. | |
| 5,657,332 A | 8/1997 | Auclair et al. | |
| 5,661,060 A | 8/1997 | Gill et al. | |
| 5,663,907 A | 9/1997 | Frayer et al. | |
| 5,672,959 A | 9/1997 | Der | |
| 5,675,280 A | 10/1997 | Nomura | |
| 5,677,869 A | 10/1997 | Fazio et al. | |
| 5,683,925 A | 11/1997 | Irani et al. | |
| 5,689,459 A | 11/1997 | Chang et al. | |
| 5,694,356 A | 12/1997 | Wong et al. | |

| | | | | | |
|---|---|---|---|---|---|
| 5,696,929 A | 12/1997 | Hasbun et al. | 5,982,666 A | 11/1999 | Campardo |
| 5,708,608 A | 1/1998 | Park et al. | 5,986,940 A | 11/1999 | Atsumi et al. |
| 5,712,814 A | 1/1998 | Fratin et al. | 5,990,526 A | 11/1999 | Bez et al. |
| 5,712,815 A | 1/1998 | Bill et al. | 5,991,202 A | 11/1999 | Derhacobian et al. |
| 5,715,193 A | 2/1998 | Norman | 5,999,444 A | 12/1999 | Fujiwara et al. |
| 5,717,581 A | 2/1998 | Canclini | 5,999,494 A | 12/1999 | Holzrichter |
| 5,717,632 A | 2/1998 | Richart et al. | 6,000,006 A | 12/1999 | Bruce et al. |
| 5,717,635 A | 2/1998 | Akatsu | 6,005,423 A | 12/1999 | Schultz |
| 5,726,946 A | 3/1998 | Yamagata et al. | 6,011,725 A | 1/2000 | Eitan |
| 5,748,534 A | 5/1998 | Dunlap et al. | 6,018,186 A | 1/2000 | Hsu |
| 5,751,037 A | 5/1998 | Aozasa et al. | 6,020,241 A | 2/2000 | You et al. |
| 5,751,637 A | 5/1998 | Chen et al. | 6,028,324 A | 2/2000 | Su et al. |
| 5,754,475 A | 5/1998 | Bill et al. | 6,030,871 A | 2/2000 | Eitan |
| 5,760,445 A | 6/1998 | Diaz | 6,034,403 A | 3/2000 | Wu |
| 5,760,634 A | 6/1998 | Fu | 6,034,896 A | 3/2000 | Ranaweera et al. |
| 5,768,192 A | 6/1998 | Eitan | 6,037,627 A | 3/2000 | Kitamura et al. |
| 5,768,193 A | 6/1998 | Lee et al. | 6,040,610 A | 3/2000 | Noguchi et al. |
| 5,771,197 A | 6/1998 | Kim | 6,044,019 A | 3/2000 | Cernea et al. |
| 5,774,395 A | 6/1998 | Richart et al. | 6,044,022 A | 3/2000 | Nachumovsky |
| 5,777,919 A | 7/1998 | Chi-Yung et al. | 6,063,666 A | 5/2000 | Chang et al. |
| 5,781,476 A | 7/1998 | Seki et al. | 6,064,226 A | 5/2000 | Earl |
| 5,781,478 A | 7/1998 | Takeuchi et al. | 6,064,251 A | 5/2000 | Park |
| 5,784,314 A | 7/1998 | Sali et al. | 6,064,591 A | 5/2000 | Takeuchi et al. |
| 5,787,036 A | 7/1998 | Okazawa | 6,074,916 A | 6/2000 | Cappelletti |
| 5,793,079 A | 8/1998 | Georgescu et al. | 6,075,402 A | 6/2000 | Ghilardelli et al. |
| 5,801,076 A | 9/1998 | Ghneim et al. | 6,075,724 A | 6/2000 | Li et al. |
| 5,805,500 A | 9/1998 | Campardo et al. | 6,078,518 A | 6/2000 | Chevallier |
| 5,808,506 A | 9/1998 | Tran | 6,081,456 A | 6/2000 | Dadashev |
| 5,812,449 A | 9/1998 | Song | 6,084,794 A | 7/2000 | Lu et al. |
| 5,812,456 A | 9/1998 | Hull et al. | 6,091,640 A | 7/2000 | Kawahara et al. |
| 5,812,457 A | 9/1998 | Arase | 6,094,095 A | 7/2000 | Murray et al. |
| 5,815,435 A | 9/1998 | Van Tran | 6,097,639 A | 8/2000 | Choi et al. |
| 5,822,256 A | 10/1998 | Bauer et al. | 6,107,862 A | 8/2000 | Mukainakano et al. |
| 5,825,683 A | 10/1998 | Chang et al. | 6,108,240 A | 8/2000 | Lavi et al. |
| 5,825,686 A | 10/1998 | Schmitt-Landsiedel et al. | 6,108,241 A | 8/2000 | Chevallier |
| 5,828,601 A | 10/1998 | Hollmer et al. | 6,117,714 A | 9/2000 | Beatty |
| 5,834,851 A | 11/1998 | Ikeda et al. | 6,118,207 A | 9/2000 | Ormerod et al. |
| 5,835,935 A | 11/1998 | Estakhri et al. | 6,118,692 A | 9/2000 | Banks |
| 5,836,772 A | 11/1998 | Chang et al. | 6,122,198 A | 9/2000 | Haddad et al. |
| 5,841,700 A | 11/1998 | Chang | 6,128,226 A | 10/2000 | Eitan et al. |
| 5,847,441 A | 12/1998 | Cutter et al. | 6,128,227 A | 10/2000 | Kim |
| 5,861,771 A | 1/1999 | Matsuda et al. | 6,130,572 A | 10/2000 | Ghilardelli et al. |
| 5,862,076 A | 1/1999 | Eitan | 6,130,574 A | 10/2000 | Bloch et al. |
| 5,864,164 A | 1/1999 | Wen | 6,133,095 A | 10/2000 | Eitan et al. |
| 5,867,429 A | 2/1999 | Chen et al. | 6,134,156 A | 10/2000 | Eitan |
| 5,870,334 A | 2/1999 | Hemink et al. | 6,137,718 A | 10/2000 | Reisinger |
| 5,870,335 A | 2/1999 | Khan et al. | 6,147,904 A | 11/2000 | Liron |
| 5,875,128 A | 2/1999 | Ishizuka et al. | 6,148,435 A | 11/2000 | Bettman |
| 5,877,537 A | 3/1999 | Aoki | 6,150,800 A | 11/2000 | Kinoshita et al. |
| 5,880,620 A | 3/1999 | Gitlin et al. | 6,154,081 A | 11/2000 | Pakkala et al. |
| 5,886,927 A | 3/1999 | Takeuchi | 6,156,149 A | 12/2000 | Cheung et al. |
| RE36,179 E | 4/1999 | Shimoda | 6,157,242 A | 12/2000 | Fukui |
| 5,892,710 A | 4/1999 | Fazio et al. | 6,157,570 A | 12/2000 | Nachumovsky |
| 5,903,031 A | 5/1999 | Yamada et al. | 6,163,048 A | 12/2000 | Hirose et al. |
| 5,910,924 A | 6/1999 | Tanaka et al. | 6,163,484 A | 12/2000 | Uekubo |
| 5,920,503 A | 7/1999 | Lee et al. | 6,169,691 B1 | 1/2001 | Pasotti et al. |
| 5,920,507 A | 7/1999 | Takeuchi et al. | 6,175,523 B1 | 1/2001 | Yang et al. |
| 5,926,409 A | 7/1999 | Engh et al. | 6,181,597 B1 | 1/2001 | Nachumovsky |
| 5,930,195 A | 7/1999 | Komatsu et al. | 6,181,605 B1 | 1/2001 | Hollmer et al. |
| 5,933,366 A | 8/1999 | Yoshikawa | 6,185,143 B1 | 2/2001 | Perner et al. |
| 5,933,367 A | 8/1999 | Matsuo et al. | 6,188,211 B1 | 2/2001 | Rincon-Mora et al. |
| 5,936,888 A | 8/1999 | Sugawara | 6,192,445 B1 | 2/2001 | Rezvani |
| 5,940,332 A | 8/1999 | Artieri | 6,195,196 B1 | 2/2001 | Kimura et al. |
| 5,946,258 A | 8/1999 | Evertt et al. | 6,198,342 B1 | 3/2001 | Kawai |
| 5,946,558 A | 8/1999 | Hsu | 6,201,282 B1 | 3/2001 | Eitan |
| 5,949,714 A | 9/1999 | Hemink et al. | 6,201,737 B1 | 3/2001 | Hollmer et al. |
| 5,949,728 A | 9/1999 | Liu et al. | 6,205,056 B1 | 3/2001 | Pan et al. |
| 5,963,412 A | 10/1999 | En | 6,205,059 B1 | 3/2001 | Gutala et al. |
| 5,963,465 A | 10/1999 | Eitan | 6,208,200 B1 | 3/2001 | Arakawa |
| 5,966,603 A | 10/1999 | Eitan | 6,208,557 B1 | 3/2001 | Bergemont et al. |
| 5,969,989 A | 10/1999 | Iwahashi | 6,214,666 B1 | 4/2001 | Mehta |
| 5,969,993 A | 10/1999 | Takeshima | 6,215,148 B1 | 4/2001 | Eitan |
| 5,973,373 A | 10/1999 | Krautschneider et al. | 6,215,697 B1 | 4/2001 | Lu et al. |

| | | |
|---|---|---|
| 6,215,702 B1 | 4/2001 | Derhacobian et al. |
| 6,218,695 B1 | 4/2001 | Nachumovsky |
| 6,219,277 B1 | 4/2001 | Devin et al. |
| 6,219,290 B1 | 4/2001 | Chang et al. |
| 6,222,762 B1 | 4/2001 | Guterman et al. |
| 6,222,768 B1 | 4/2001 | Hollmer et al. |
| 6,233,180 B1 | 5/2001 | Eitan et al. |
| 6,240,032 B1 | 5/2001 | Fukumoto |
| 6,240,040 B1 | 5/2001 | Akaogi et al. |
| 6,246,555 B1 | 6/2001 | Tham |
| 6,252,442 B1 | 6/2001 | Malherbe |
| 6,252,799 B1 | 6/2001 | Liu et al. |
| 6,256,231 B1 | 7/2001 | Lavi et al. |
| 6,261,904 B1 | 7/2001 | Pham et al. |
| 6,265,268 B1 | 7/2001 | Halliyal et al. |
| 6,266,281 B1 | 7/2001 | Derhacobian et al. |
| 6,272,047 B1 | 8/2001 | Mihnea et al. |
| 6,275,414 B1 | 8/2001 | Randolph et al. |
| 6,281,545 B1 | 8/2001 | Liang et al. |
| 6,282,133 B1 | 8/2001 | Nakagawa et al. |
| 6,282,145 B1 | 8/2001 | Tran et al. |
| 6,285,246 B1 | 9/2001 | Basu |
| 6,285,574 B1 | 9/2001 | Eitan |
| 6,285,589 B1 | 9/2001 | Kajitani |
| 6,285,614 B1 | 9/2001 | Mulatti et al. |
| 6,292,394 B1 * | 9/2001 | Cohen et al. ........... 365/185.19 |
| 6,297,096 B1 | 10/2001 | Boaz |
| 6,297,143 B1 | 10/2001 | Foote et al. |
| 6,297,974 B1 | 10/2001 | Ganesan et al. |
| 6,304,485 B1 | 10/2001 | Harari et al. |
| 6,307,784 B1 | 10/2001 | Hamilton et al. |
| 6,307,807 B1 | 10/2001 | Sakui et al. |
| 6,320,786 B1 | 11/2001 | Chang et al. |
| 6,324,094 B1 | 11/2001 | Chevallier |
| 6,326,265 B1 | 12/2001 | Liu et al. |
| 6,330,192 B1 | 12/2001 | Ohba et al. |
| 6,331,950 B1 | 12/2001 | Kuo et al. |
| 6,335,874 B1 | 1/2002 | Eitan |
| 6,337,502 B1 | 1/2002 | Eitan et al. |
| 6,339,556 B1 | 1/2002 | Watanabe |
| 6,343,033 B1 | 1/2002 | Parker |
| 6,346,442 B1 | 2/2002 | Aloni et al. |
| 6,348,381 B1 | 2/2002 | Jong et al. |
| 6,348,711 B1 | 2/2002 | Eitan |
| 6,351,415 B1 | 2/2002 | Kushnarenko |
| 6,353,356 B1 | 3/2002 | Liu |
| 6,353,554 B1 | 3/2002 | Banks |
| 6,353,555 B1 | 3/2002 | Jeong |
| 6,356,469 B1 | 3/2002 | Roohparvar et al. |
| 6,359,501 B2 | 3/2002 | Lin et al. |
| 6,374,337 B1 | 4/2002 | Estakhri |
| 6,385,086 B1 | 5/2002 | Mihara et al. |
| 6,396,741 B1 | 5/2002 | Bloom et al. |
| 6,400,209 B1 | 6/2002 | Matsuyama et al. |
| 6,400,607 B1 | 6/2002 | Pasotti et al. |
| 6,407,537 B2 | 6/2002 | Antheunis |
| 6,410,388 B1 | 6/2002 | Kluth et al. |
| 6,417,081 B1 | 7/2002 | Thurgate |
| 6,418,506 B1 | 7/2002 | Pashley et al. |
| 6,426,898 B1 | 7/2002 | Mihnea et al. |
| 6,429,063 B1 | 8/2002 | Eitan |
| 6,433,624 B1 | 8/2002 | Grossnikle et al. |
| 6,436,766 B1 | 8/2002 | Rangarajan et al. |
| 6,436,768 B1 | 8/2002 | Yang et al. |
| 6,438,031 B1 | 8/2002 | Fastow |
| 6,438,035 B2 | 8/2002 | Yamamoto et al. |
| 6,438,037 B1 * | 8/2002 | Fastow et al. .......... 365/185.22 |
| 6,440,797 B1 | 8/2002 | Wu et al. |
| 6,442,074 B1 | 8/2002 | Hamilton et al. |
| 6,445,030 B1 | 9/2002 | Wu et al. |
| 6,449,190 B1 | 9/2002 | Bill |
| 6,452,438 B1 | 9/2002 | Li |
| 6,456,528 B1 | 9/2002 | Chen |
| 6,456,533 B1 | 9/2002 | Hamilton et al. |
| 6,458,656 B1 | 10/2002 | Park et al. |
| 6,458,677 B1 | 10/2002 | Hopper et al. |
| 6,469,929 B1 | 10/2002 | Kushnarenko et al. |
| 6,469,935 B2 | 10/2002 | Hayashi |
| 6,472,706 B2 | 10/2002 | Widdershoven et al. |
| 6,477,085 B1 | 11/2002 | Kuo |
| 6,490,204 B2 | 12/2002 | Bloom et al. |
| 6,496,414 B2 | 12/2002 | Kasa et al. |
| 6,510,082 B1 | 1/2003 | Le et al. |
| 6,512,701 B1 | 1/2003 | Hamilton et al. |
| 6,519,180 B2 | 2/2003 | Tran et al. |
| 6,519,182 B1 | 2/2003 | Derhacobian et al. |
| 6,522,585 B2 | 2/2003 | Pasternak |
| 6,525,969 B1 | 2/2003 | Kurihara et al. |
| 6,528,390 B2 | 3/2003 | Komori et al. |
| 6,529,412 B1 | 3/2003 | Chen et al. |
| 6,532,173 B2 | 3/2003 | Lioka et al. |
| 6,535,020 B1 | 3/2003 | Yin |
| 6,535,434 B2 | 3/2003 | Maayan et al. |
| 6,537,881 B1 | 3/2003 | Rangarajan et al. |
| 6,538,270 B1 | 3/2003 | Randolph et al. |
| 6,541,816 B2 | 4/2003 | Ramsbey et al. |
| 6,552,387 B1 | 4/2003 | Eitan |
| 6,555,436 B2 | 4/2003 | Ramsbey et al. |
| 6,559,500 B2 | 5/2003 | Torii |
| 6,562,683 B1 | 5/2003 | Wang et al. |
| 6,566,194 B1 | 5/2003 | Ramsbey et al. |
| 6,566,699 B2 | 5/2003 | Eitan |
| 6,567,303 B1 | 5/2003 | Hamilton et al. |
| 6,567,312 B1 | 5/2003 | Torii et al. |
| 6,570,211 B1 | 5/2003 | He et al. |
| 6,574,139 B2 | 6/2003 | Kurihara |
| 6,577,514 B2 | 6/2003 | Shor et al. |
| 6,577,532 B1 | 6/2003 | Chevallier |
| 6,577,547 B2 | 6/2003 | Ukon |
| 6,583,005 B2 | 6/2003 | Hashimoto et al. |
| 6,583,479 B1 | 6/2003 | Fastow et al. |
| 6,584,017 B2 | 6/2003 | Maayan et al. |
| 6,590,811 B1 | 7/2003 | Hamilton et al. |
| 6,593,606 B1 | 7/2003 | Randolph et al. |
| 6,594,181 B1 | 7/2003 | Yamada |
| 6,608,526 B1 | 8/2003 | Sauer |
| 6,614,295 B2 | 9/2003 | Tsuchi |
| 6,614,686 B1 | 9/2003 | Kawamura |
| 6,614,692 B2 | 9/2003 | Maayan et al. |
| 6,617,179 B1 | 9/2003 | Kim |
| 6,617,215 B1 | 9/2003 | Halliyal et al. |
| 6,618,290 B1 | 9/2003 | Wang et al. |
| 6,624,672 B2 | 9/2003 | Confaloneri et al. |
| 6,627,555 B2 | 9/2003 | Eitan et al. |
| 6,630,384 B1 | 10/2003 | Sun et al. |
| 6,633,496 B2 | 10/2003 | Maayan et al. |
| 6,633,499 B1 | 10/2003 | Eitan et al. |
| 6,633,956 B1 | 10/2003 | Mitani |
| 6,636,440 B2 | 10/2003 | Maayan et al. |
| 6,639,271 B1 | 10/2003 | Zheng et al. |
| 6,639,837 B2 | 10/2003 | Takano et al. |
| 6,639,844 B1 | 10/2003 | Liu et al. |
| 6,639,849 B2 | 10/2003 | Takahashi et al. |
| 6,642,148 B1 | 11/2003 | Ghandehari et al. |
| 6,642,573 B1 | 11/2003 | Halliyal et al. |
| 6,642,586 B2 | 11/2003 | Takahashi |
| 6,643,170 B2 | 11/2003 | Huang et al. |
| 6,643,177 B1 | 11/2003 | Le et al. |
| 6,643,178 B2 | 11/2003 | Kurihara |
| 6,643,181 B2 * | 11/2003 | Sofer et al. ............ 365/185.22 |
| 6,645,801 B1 | 11/2003 | Ramsbey et al. |
| 6,649,972 B2 | 11/2003 | Eitan |
| 6,650,568 B2 | 11/2003 | Iijima |
| 6,653,190 B1 | 11/2003 | Yang et al. |
| 6,653,191 B1 | 11/2003 | Yang et al. |
| 6,654,296 B2 | 11/2003 | Jang et al. |

| | | | | | | |
|---|---|---|---|---|---|---|
| 6,664,588 | B2 | 12/2003 | Eitan | 2004/0157393 A1 | 8/2004 | Hwang |
| 6,665,769 | B2 | 12/2003 | Cohen et al. | 2004/0222437 A1 | 11/2004 | Avni et al. |
| 6,670,241 | B1 | 12/2003 | Kamal et al. | 2005/0058005 A1 | 3/2005 | Shappir et al. |
| 6,670,669 | B1 | 12/2003 | Kawamura | 2005/0117395 A1 | 6/2005 | Maayan et al. |
| 6,674,138 | B1 | 1/2004 | Halliyal et al. | 2005/0140405 A1 | 6/2005 | Do et al. |
| 6,677,805 | B2 | 1/2004 | Shor et al. | | | |
| 6,680,509 | B1 | 1/2004 | Wu et al. | FOREIGN PATENT DOCUMENTS | | |
| 6,686,242 | B2 | 2/2004 | Willer et al. | EP | 0751560 | 6/1995 |
| 6,690,602 | B1 | 2/2004 | Le et al. | EP | EP 0693781 | 1/1996 |
| 6,700,818 | B2 | 3/2004 | Shappir et al. | EP | 0 822 557 | 2/1998 |
| 6,717,207 | B2 | 4/2004 | Kato | EP | 0 843 398 | 5/1998 |
| 6,723,518 | B2 | 4/2004 | Papsidero et al. | EP | 0580467 | 9/1998 |
| 6,731,542 | B1 | 5/2004 | Le et al. | EP | 0461764 | 7/2000 |
| 6,738,289 | B2 | 5/2004 | Gongwer et al. | EP | 1 071 096 | 1/2001 |
| 6,744,692 | B2 | 6/2004 | Shiota et al. | EP | 1073120 | 1/2001 |
| 6,765,259 | B2 | 7/2004 | Kim | EP | 1 091 418 | 4/2001 |
| 6,768,165 | B1 | 7/2004 | Eitan | EP | 1126468 | 8/2001 |
| 6,788,579 | B2 | 9/2004 | Gregori et al. | EP | 0740307 | 12/2001 |
| 6,791,396 | B2 | 9/2004 | Shor et al. | EP | 1164597 | 12/2001 |
| 6,794,249 | B2 | 9/2004 | Palm et al. | EP | 1 207 552 | 5/2002 |
| 6,831,872 | B2 | 12/2004 | Matsuoka | EP | 1 223 586 | 7/2002 |
| 6,836,431 | B2 | 12/2004 | Chang | EP | 1 365 452 | 11/2003 |
| 6,871,258 | B2 | 3/2005 | Micheloni et al. | EP | 001217744 | 3/2004 |
| 6,885,585 | B2 | 4/2005 | Maayan et al. | GB | 1297899 | 11/1972 |
| 6,898,118 | B2 * | 5/2005 | Miwa et al. ............ 365/185.03 | GB | 2157489 | 3/1985 |
| 6,912,160 | B2 | 6/2005 | Yamada | JP | 54-053929 | 4/1979 |
| 6,917,544 | B2 | 7/2005 | Maayan et al. | JP | 60-200566 | 10/1985 |
| 6,928,001 | B2 | 8/2005 | Avni et al. | JP | 60201594 | 10/1985 |
| 6,937,523 | B2 | 8/2005 | Eshel | JP | 63-249375 | 10/1988 |
| 6,967,872 | B2 | 11/2005 | Quader et al. | JP | 3-285358 | 12/1991 |
| 6,996,692 | B2 | 2/2006 | Kouno | JP | 04-226071 | 8/1992 |
| 7,190,620 | B2 * | 3/2007 | Maayan et al. ......... 365/185.19 | JP | 04-291962 | 10/1992 |
| 2001/0006477 | A1 | 7/2001 | Banks | JP | 05021758 | 1/1993 |
| 2002/0004878 | A1 | 1/2002 | Norman | JP | 05-326893 | 12/1993 |
| 2002/0004921 | A1 | 1/2002 | Muranaka et al. | JP | 06151833 | 5/1994 |
| 2002/0064911 | A1 | 5/2002 | Eitan | JP | 06-232416 | 8/1994 |
| 2002/0132436 | A1 | 9/2002 | Ellyahu et al. | JP | 07193151 | 7/1995 |
| 2002/0140109 | A1 | 10/2002 | Keshavarzi et al. | JP | 08-106791 | 4/1996 |
| 2002/0145465 | A1 | 10/2002 | Shor et al. | JP | 08-297988 | 11/1996 |
| 2002/0191465 | A1 | 12/2002 | Maayan et al. | JP | 09-017981 | 1/1997 |
| 2002/0199065 | A1 | 12/2002 | Subramoney et al. | JP | 09162314 | 6/1997 |
| 2003/0001213 | A1 | 1/2003 | Lai | JP | 10-106276 | 4/1998 |
| 2003/0021155 | A1 | 1/2003 | Yachareni et al. | JP | 10 334676 | 12/1998 |
| 2003/0072192 | A1 | 4/2003 | Bloom et al. | JP | 11-162182 | 6/1999 |
| 2003/0076710 | A1 | 4/2003 | Sofer et al. | JP | 11-354758 | 12/1999 |
| 2003/0117841 | A1 | 6/2003 | Yamashita et al. | JP | 2001-085646 | 3/2001 |
| 2003/0131186 | A1 | 7/2003 | Buhr | JP | 2001-118392 | 4/2001 |
| 2003/0134476 | A1 | 7/2003 | Roizin et al. | JP | 2001-156189 | 6/2001 |
| 2003/0142544 | A1 | 7/2003 | Maayan et al. | JP | 2002-216488 | 8/2002 |
| 2003/0145176 | A1 | 7/2003 | Dvir et al. | JP | 3358663 | 12/2002 |
| 2003/0145188 | A1 | 7/2003 | Cohen et al. | WO | WO 81/00790 | 3/1981 |
| 2003/0147284 | A1 * | 8/2003 | Miwa et al. ............ 365/185.03 | WO | WO 96/15553 | 5/1996 |
| 2003/0155659 | A1 | 8/2003 | Verma et al. | WO | WO 96/25741 | 8/1996 |
| 2003/0190786 | A1 | 10/2003 | Ramsbey et al. | WO | WO 98/03977 | 1/1998 |
| 2003/0197221 | A1 | 10/2003 | Shinozaki et al. | WO | WO 99/31670 | 6/1999 |
| 2003/0202411 | A1 | 10/2003 | Yamada | WO | WO 99/57728 | 11/1999 |
| 2003/0206435 | A1 | 11/2003 | Takahashi | WO | WO 00/46808 | 8/2000 |
| 2003/0208663 | A1 | 11/2003 | Van Buskirk et al. | WO | WO 01/65566 | 9/2001 |
| 2003/0209767 | A1 | 11/2003 | Takahashi et al. | WO | WO 01/65567 | 9/2001 |
| 2003/0214844 | A1 | 11/2003 | Iijima | WO | WO 01/84552 | 11/2001 |
| 2003/0218207 | A1 | 11/2003 | Hashimoto et al. | WO | WO 02/43073 | 5/2002 |
| 2003/0218913 | A1 | 11/2003 | Le et al. | WO | WO 03/032393 | 4/2003 |
| 2003/0222303 | A1 | 12/2003 | Fukuda et al. | WO | WO 03/036651 | 5/2003 |
| 2003/0227796 | A1 | 12/2003 | Miki et al. | WO | WO 03/054964 | 7/2003 |
| 2004/0012993 | A1 | 1/2004 | Kurihara | WO | WO 03/063167 | 7/2003 |
| 2004/0013000 | A1 | 1/2004 | Torii | WO | WO 03/063168 | 7/2003 |
| 2004/0014290 | A1 | 1/2004 | Yang et al. | WO | WO 03/079370 | 9/2003 |
| 2004/0021172 | A1 | 2/2004 | Zheng et al. | WO | WO 03/079446 | 9/2003 |
| 2004/0027858 | A1 | 2/2004 | Takahashi et al. | WO | WO 03/083916 | 10/2003 |
| 2004/0047198 | A1 * | 3/2004 | Lusky et al. ................ 365/200 | WO | WO 03/088258 | 10/2003 |
| 2004/0117395 | A1 | 6/2004 | Gong et al. | WO | WO 03/088259 | 10/2003 |
| 2004/0151034 | A1 | 8/2004 | Shor et al. | WO | WO 03/088260 | 10/2003 |
| 2004/0153621 | A1 | 8/2004 | Polansky et al. | | | |

| WO | WO 03/088261 | 10/2003 |
| WO | WO 03/088353 | 10/2003 |
| WO | WO 03/100790 | 12/2003 |

OTHER PUBLICATIONS

Bude et al., EEPROM/Flash Sub 3.0V drain—Source Bias Hot Carrier Writing, IEDM, 1995, pp. 989-992.

Bude et al., Secondary Electron Flash—a High Performance, Low Power Flash Technology for 0.35 um and below, IEDM, 1997, 279-282.

Bude et al., Modeling Nonequilibrium Hot Carrier Device Effects, Conference of Insulator Specialists of Europe, Jun. 1997, Sweden.

Jung et al., IEEE Journal of Solid-State Circuits, Nov. 1996, 1575-1583, vol. 31, No. 11.

Campardo et al., IEEE Journal of Solid-State Circuits, Nov. 2000, 1655-1667, vol. 35, No. 11.

Lin et al., Novel Source-Controlled Self-Verified Programming for Multilevel EEPROM's, IEEE Transactions on Electron Devices, Jun. 2000, 1166-1174, vol. 47, No. 6.

Chan et al., A True Single-Transistor Oxide-Nitride-Oxide EEPROM Device, IEEE Electron Device Letters, Mar. 1987, vol. EDL-8, No. 3.

Eitan et al., "Hot-Electron Injection into the Oxide in n-Channel MOS Devices", IEEE Transactions on Electron Devices, vol. ED-28, No. 3, pp. 328-370, Mar. 1981.

Roy Anirban, "Characterization and Modeling of Charge Trapping and Retention in Novel Multi-Dielectric Nonvolatile Semiconductor Memory Devices", Microelectronics Laboratory, Sherman Fairchild Center, Department of Computer Science and Electrical Engineering, Bethlehem, Pennsylvania, p. 1-35, 1989.

Ma et al., A Dual-bit Split-Gate EEPROM (DSG) Cell in Contactless Array for Single-Vcc High Density Flash Memories, IEEE, 1994, 57-60.

Oshima et al., Process and Device Technologies for 16Mbit EPROMs with Large-Tilt-Angle Implanted P-Pocket Cell, IEEE, Dec. 1990, Ch. 2865-4/90/0000-0095, pp. 521-524, San Francisco, California.

Lee, A new approach for the floating-gate MOS nonvolatile memory, Applied Physics Letters, Oct. 1997, 475-476, vol. 31, No. 7, American Institute of Physics.

Glasser et al., MOS Device Electronics, The Design and Analysis of VLSI Circuits, Chapter 2, 67-163, 1998, Addison-Wesley Publishing Company.

Bhattacharyya et al., FET Gate Structure for Nonvolatile N-Channel Read-Mostly Memory Device, IBM Technical Disclosure Bulletin, Nov. 1975, 1768, vol. 18, No. 6.

Ricco et al., Nonvolatile Multilevel Memories for Digital Applications, Dec. 1998, 2399-2421, vol. 86, No. 12, Institute of Electrical and Electronics Engineers, Inc.

Martin, Improved Circuits for the Realization of Switched-Capacitor Filters, IEEE Transactions on Circuits and Systems, Apr. 1980. 237-244, vol. CAS-27.

Tseng et al., "Thin CVD Stacked Gate Dielectric for ULSI Technology", IEEE, pp. 321-214; 1993, 13.1.1-13.1.4.

Pickar, Ion Implementation is Silicon—Physics, Processing, and Microelectronic Devices, Applied Solid State Science, 1975, 151-241, vol. 5, Academic Press.

2 Bit/Cell EEPROM Cell Using Band-To-Band Tunneling for Data Read-Out, IBM Technical Disclosure Bulletin, 1992, 136-140, vol. 35 No. 4B.

Umezawa et al., A 5-V-Only Operation 0.6-µm Flash EEPROM with Row Decoder Scheme in Triple-Well Structure, IEEE Journal of Solid-State Circuits, 1992, 1540, vol. 27.

Mitchell et al., A new self-aligned planar array cell for ultra high density EPROMS, 1987.

Esquivel et al., High Density Contactless, Self Aligned EPROM Cell Array Technology, 1986.

Johns, Martin, Analog Integrated Circuit Design, Jun. 1, 1997, Chapter 10, John Wiley and Sons Inc.

Allen et al., CMOS Analog Circuit Design, 2002, 259 pages, Oxford University Press.

Klinke et al., A very-high-slew-rate CMOS operational amplifier, IEEE Journal of Solid-State Circuits, 1989, 744-746, 24 Vol.

Shor et al, paper WA2.04.01—Self regulated Four phased charge pump with boosted wells, ISCAS 2002.

Fotouhi, An efficient CMOS line driver for 1.544-Mb/s T1 and 2.048-Mb/s E1 applications, IEEE Journal of Solid-State Circuits, 2003, 226-236pages, 38vol.

P-N Junction Diode, Physics of semiconductor devices, 1981, Ch. 2, "A Wiley-Interscience Publication", John Wiley & Sons Publishers.

Chang, Non Volatile Semiconductor Memory Devices, Proceedings of the IEEE, 64 vol., No. 7, pp. 1039-1059; Jul. 1976.

Yoon, Sukyoon, et al., A Novel Substrate Hot Electron and Hole Injection Structure with a double-implanted buried-channel MOSFET, IEEE Transactions on Electron Devices, Dec. 1991, p. 2722, vol. 38, No. 12.

4 Bits of Digital Data Fit in a Single Cell, Technology Newsletter, Electronic Design, Apr. 1, 1996.

M. Specht et al, Novel Dual Bit Tri- Gate Charge Trapping Memory Devices, IEEE Electron Device Letters, vol. 25, No. 12, Dec. 2004, pp. 810-812.

Bu, Jiankang et al., "Design Considerations in Scaled SONOS Nonvolatile Memory Devices" Lehigh University, Bethlehem, PA, Power Point Presentaiton, pp. 1-24, 2000; http://klabs.org/richcontent/MemoryContent/nvmt_symp/nvmts_2000/presentations/bu_white_sonos_lehigh_univ.pdf.

Adams et al., "SONOS Nonvolatile Semiconductor Memories for Space and Military Applications", Symposium, 2000. http://klabs.org/richcontent/MemoryContent/nvmt_symp/nvmts_2000/papers/adams_d.pdf.

"Philips Research—Technologies—Embedded Nonvolatile Memories" http://research. philips.com/technologies/ics/nvmemories/index.html.

"Semiconductor Memory: Non-Volatile Memory (NVM)", National University of Singapore, Department of Electrical and Computer Engineering: http://ece.nus.edu.sg/stfpage/elezhucx/myweb/NVM.pdf.

"Saifun Non-Volatile Memory Technology", 1st Edition, 2005, published and written by Saifun Semicondcutors Ltd., 1110 pgs.

European Search Report 06100507.0, Mar. 6, 2007.

Tanaka et al. "A Quick Intelligent Page-Programming Architecture and a Shielded Bitline Sensing Method for 3 V-Only NAND Flash Memory" IEEE journal of Solid-State Circuits, vol. 29, No. 11, Nov. 1994.

* cited by examiner

SET ADDITIONAL MARGIN IN OPERATING
WINDOW BETWEEN EV LEVEL AND READ LEVEL

SHIFT PROGRAM VERIFY LEVEL IN ORDER
NOT TO REDUCE MARGIN TO READ LEVEL

SET EXTRA PULSE MECHANISM TO MORE
AGGRESSIVE VALUE TO INSURE ALL CELLS
ARE BELOW THE ERASE VERIFY LEVEL

BUNCH SUBGROUP TO SMALL NUMBER OF WORD
LINES TO FURTHER REDUCE SWITCHING OVERHEAD

PARTITION ERASE OPERATION TO SUBGROUPS IN
ORDER TO MINIMIZE OVER ERASURE OF CELLS

FIG. 7B

PARTIAL ERASE VERIFY

CROSS-REFERENCE TO RELATED APPLICATIONS

The present application claims priority from U.S. Provisional Application Ser. No. 60/644,569, filed Jan. 19, 2005, which is incorporated herein by reference.

FIELD OF THE INVENTION

The present invention relates generally to operating memory cells of non-volatile memory (NVM) arrays, such as programming and erasing, and particularly to methods for reducing erase pulse and erase verify operations on such arrays,

BACKGROUND OF THE INVENTION

Modern day non-volatile memory products incorporate the ability to electrically program and erase the memory cells. In most manifestations, the erase operation is preformed on a subset of cells and not individually cell-by-cell, as normally performed during the programming operation. This means that erasure conditions are applied to the subset until the last (slowest) cell finishes erasure, i.e. is verified as passing a predetermined level (erase verify).

Memory products incorporating tunneling enhanced hot hole injection during erasure, as in NROM (nitride read-only memory) technology, require high biasing of the transistor junction to create the injected holes, through band-to-band tunneling, as may be seen in FIG. 1. Charge injection must be controlled to insure proper device operation, and accordingly, step and verify algorithms are typically implemented. In a typical algorithm, charge is injected at a certain bias following by a verify operation to ascertain whether the cell has reached its destination. If the destination has not been achieved, stronger charge injection is initiated via a higher bias and vice versa. For tunneling enhanced hot hole injection, this flow usually has to be performed on both sides of the memory cell separately, resulting in longer erase time and lower performance.

During the lifetime of the device and specifically after intensive cycling (consecutive program and erase operations) the voltages required to erase an NROM or NROM-like cell increase. For example, FIG. 2 illustrates an example of a typical prior art erase curve of an NROM cell before and after cycling. The graph shows the degradation of the erase operation, in which higher voltages are required to erase the cell after cycling.

FIG. 3 illustrates another example of the detrimental effects cycling has on the erasure voltage. Specifically, FIG. 3 illustrates erase voltage and step count of a prior art NROM based memory product, as a function of the number of program/erase operations (cycle count) performed on the device. The drain voltage (Vppd) increases up to a certain voltage (e.g., 7.1 V, the maximum allowed value in the specific product shown in the graph), together with an increase of the number of pulses. After reaching the maximum allowed voltage, the voltage level becomes clamped.

Since the initial erase voltages are set during the beginning of life testing, a time penalty in the erase operation is accumulated, which translates into low product performance in the middle to end of life range.

Many options have been proposed and tried in the prior art to enhance the efficiency of the hole-injection-based erase flow. One option applies an extra erase pulse at a higher level than the last pulse used to reach full erasure for improving reliability. Application of additional pulses is taught in various patent documents, such as U.S. Pat. No. 6,700,818 and US Patent Applications 20050117395 and 20050058005, all assigned to the present assignee of the present application, the disclosures of which are incorporated herein by reference.

Another option uses large voltage strides between consecutive steps. However, this may result in poor control of the operation. Still another option uses multiple strides. Since charge injection is usually performed for many cells in parallel, the rationale of this option is that large strides can be incorporated until a first cell ensemble reaches a target, followed by smaller strides until the full population is done.

Another option is that of a learning phase, in which a prior step level ascertained from a previous cell group or erase operation of the same group is implemented on the rest of the array in order to achieve fast convergence Yet another option calls for dialing in the first pulse level during product sort. However, this does not insure a low pulse count over time.

Another option uses multiple verify levels. This may achieve a faster convergence to the final pulse level, but requires a more intricate design and a longer verify time. Another option calls for alternating between the two sides of the cell in the pulse application/verification operations This approach may result in a twofold improvement in erase performance, but may lead to reduced control.

Another option uses increased erase parallelism through the reduction of the power consumption. In another option, erase verification is stopped if sufficient cells fail erasure. Erase verification then continues after applying an additional erase pulse, at the address of the first failure. However, in all of the abovementioned prior art methods, all cells in the erase group must pass several erase verifications, including a penalty of associated word line switching overhead, before the erase operation is completed.

SUMMARY OF THE INVENTION

The present invention seeks to provide methods for erasing bits of memory cells in memory arrays, and for reducing erase pulse and erase verify operations of such arrays. The invention is described in detail hereinbelow with reference to memory cells of NVM arrays, and particularly to single bit, dual bit, multi-bit and multi-level NROM cells, wherein erasing generally involves changing the threshold voltage level of a bit to a target threshold level. However, the invention is not limited to NROM arrays.

In one non-limiting embodiment, in order to reduce the total time of the erase operation, the verification and switching time is reduced. By shortening the verify operation between hole injection pulses, the abovementioned time penalty of the prior art may be reduced. This may substantially improve product performance.

There is thus provided in accordance with an embodiment of the invention a method for erasing memory cells in a memory array, the method including applying an erase pulse to all bits of a cell ensemble of a memory cell array, and performing an erase verification operation only on a subgroup of the cell ensemble being erased to check if the memory cell threshold voltages (Vt) have been lowered to an erase verify (EV) voltage level, and if so, stopping the erase operation on the entire cell ensemble with or without checking the remaining subgroups of the cell ensemble.

In accordance with an embodiment of the invention the entire cell ensemble may be verified as being erased only after the subgroup has been verified as being erased.

Further in accordance with an embodiment of the invention, the subgroup may be verified as being erased to a level lower than the target EV level, in order to insure that the entire cell ensemble has been erased, even though not all the cells have been verified as such.

In accordance with an embodiment of the invention, the method may further include minimizing verification time overhead.

In accordance with an embodiment of the invention performing the erase verification operation may be done after bunching the subgroup to a small number of word lines to further reduce switching overhead.

Further in accordance with an embodiment of the invention a set margin may be increased between a read level and the erase verify level, or between a read level and the erase verify and program verify levels.

In accordance with an embodiment of the invention, the method may further include applying an erase pulse to a plurality of subgroups of the cell ensemble, but not performing erase verification operations on all of the subgroups.

In accordance with an embodiment of the invention, the method may further include insuring that a number of bits have passed a set level, and producing a high probability that the entire cell ensemble has been passed erase verification, even though only a subgroup of cells have been physically verified as passing erase verification.

In accordance with an embodiment of the invention, the method may further include applying extra erase pulses after erase verification has been completed.

In accordance with an embodiment of the invention, the subgroup of the cell ensemble which is erase verified may be alternated between all the subgroups including the cell ensemble, regularly, periodically or randomly from erase operation to erase operation.

BRIEF DESCRIPTION OF THE DRAWINGS

The present invention will be understood and appreciated more fully from the following detailed description taken in conjunction with the appended drawings in which:

FIG. 7B is a flow chart of compensating for the margin loss due to the mismatch of the subgroup with respect to the full cell ensemble, in accordance with an embodiment of the invention.

DETAILED DESCRIPTION OF EMBODIMENTS

Figure 1:
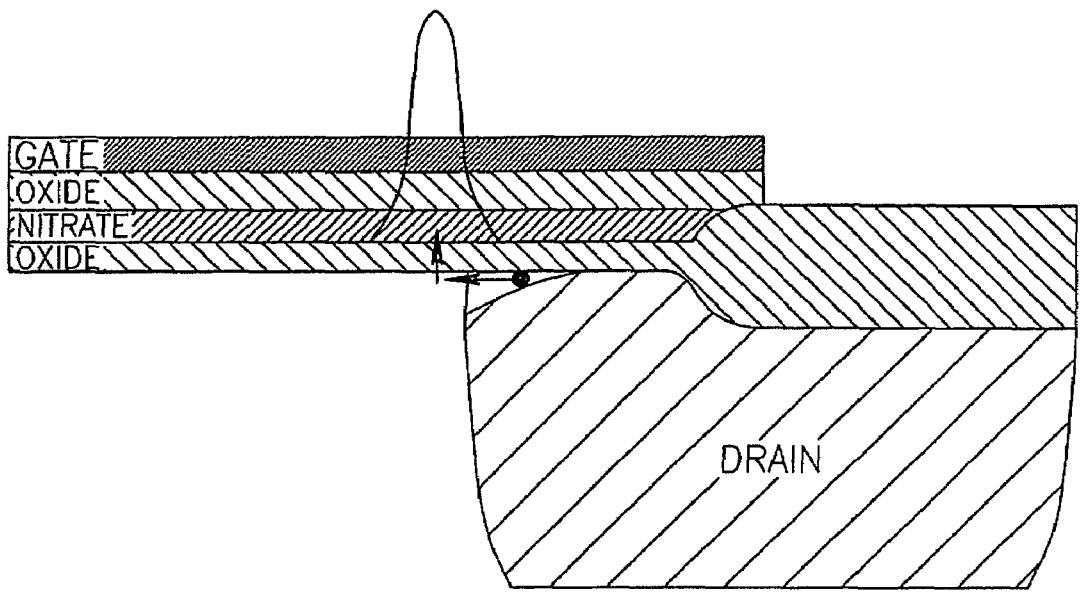
FIG. 1 is a simplified graph of erasing NROM cells by tunneling enhanced hot hole injection in the prior art.
Figure 1:
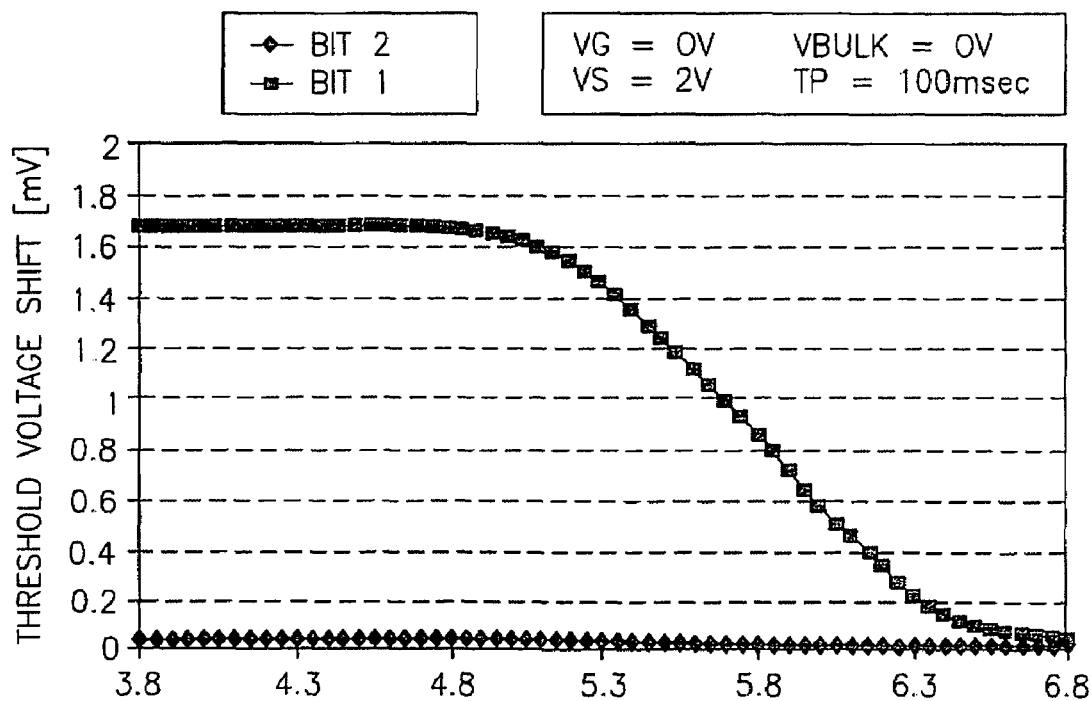
Figure 2:
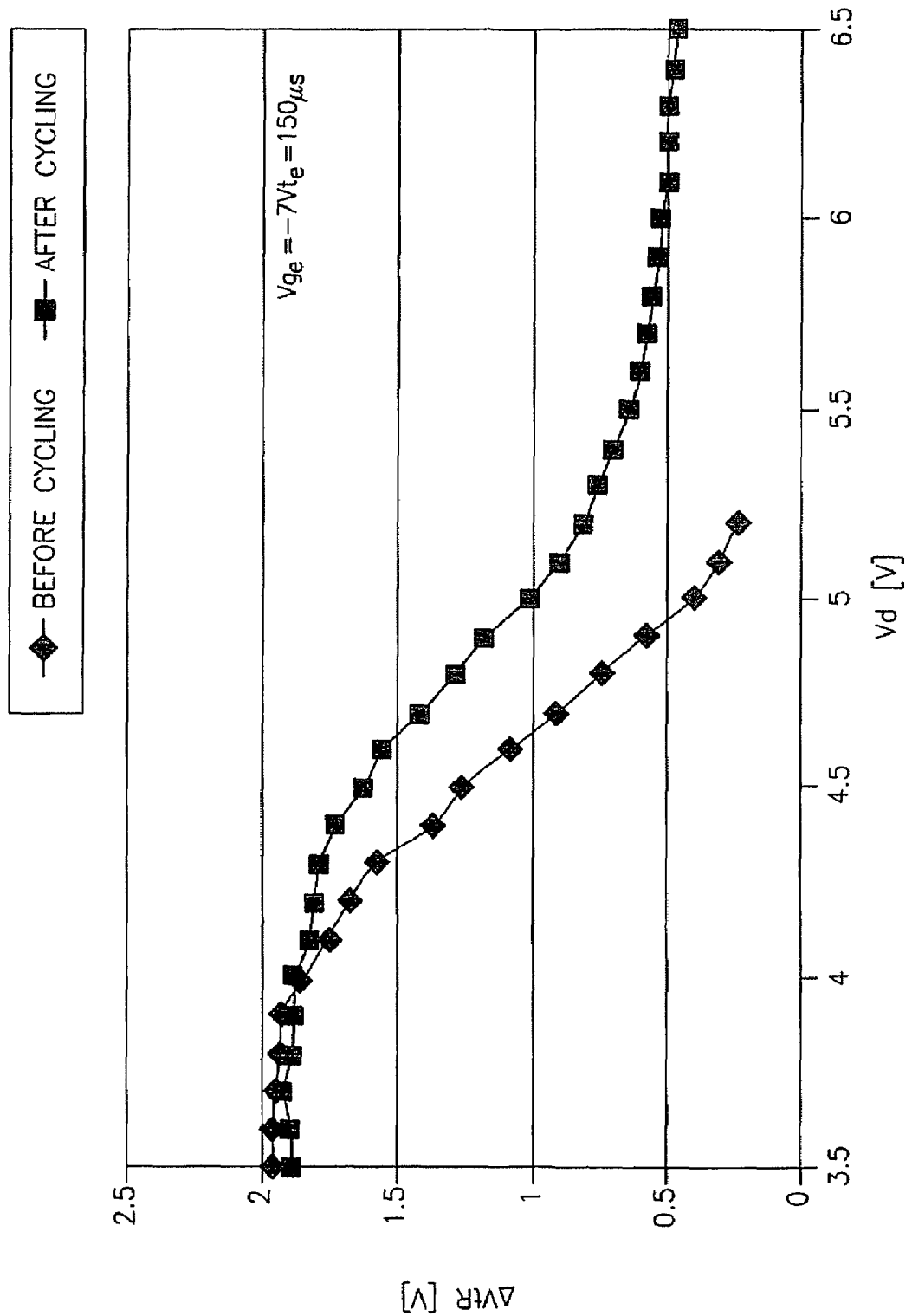
FIG. 2 are typical prior art erase curves of an NROM cell before and after cycling, showing the degradation of the erase operation.
Figure 3:
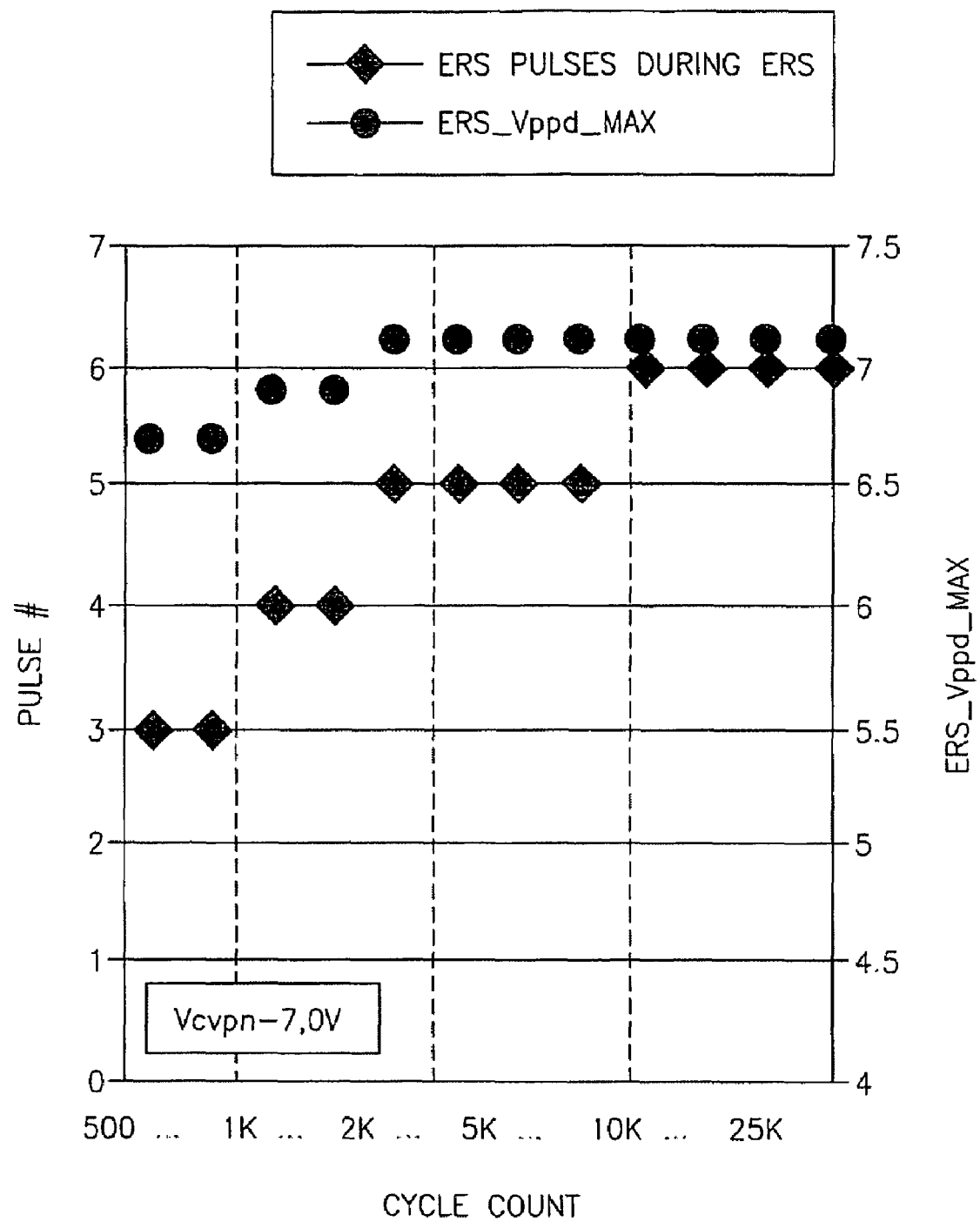
FIG. 3 is a simplified graph of erase voltage and step count of a prior art NROM based memory product, as a function of the number of program/erase operations (cycle count) performed on the device.
Figure 4A:
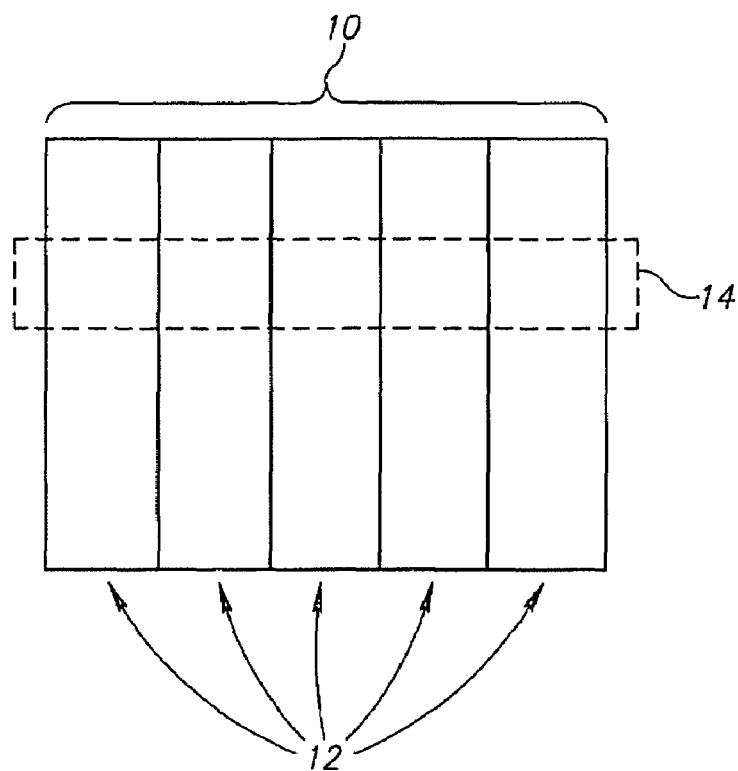
FIGS. 4A and 4B are simplified schematic illustrations of examples of cell ensembles in a memory array partitioned to subdivisions, in accordance with embodiments of the present invention.
Figure 4B:
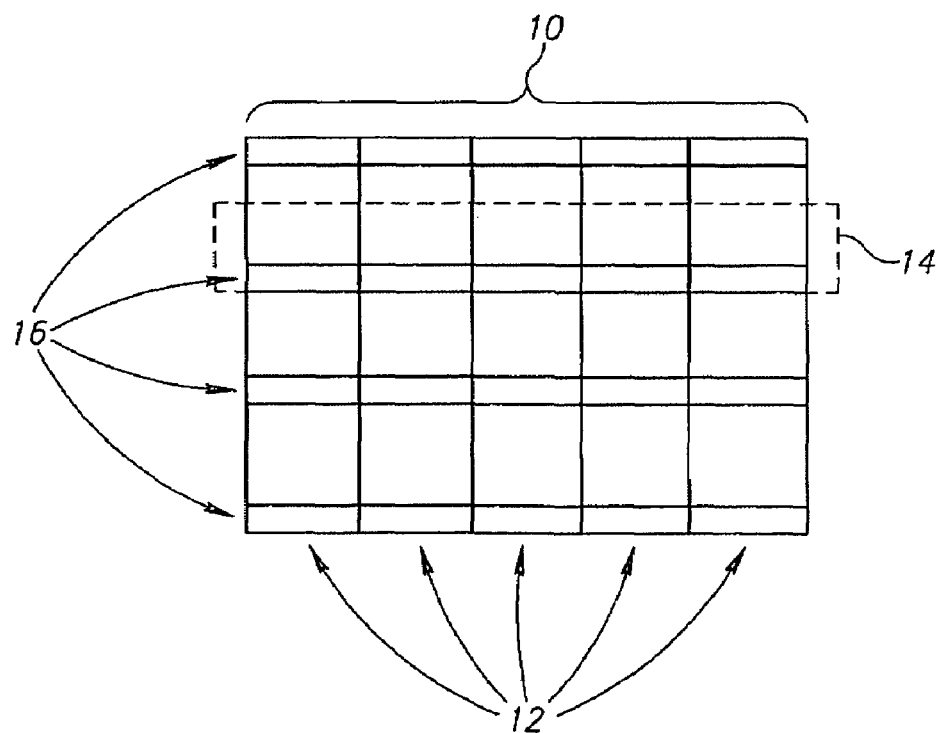

In order to better understand the terminology used herein for partitions of cell ensembles, reference is now made to FIGS. 4A and 4B, which illustrate examples of cell ensembles in a memory array partitioned to subdivisions, in accordance with embodiments of the present invention. FIG. 4A is a schematic example of a cell ensemble 10 in a memory array partitioned to subdivisions 12 (by DQ's in this case), and a subgroup 14, containing cells from all subdivisions 12, which will be erased verified (instead of the entire ensemble), as described hereinbelow. The ensemble subdivisions 12 and subgroups 14 may take any form. FIG. 4B illustrates another example of partitioning cell ensemble 10 to subdivisions. In this example, cell ensemble 10 is subdivided into subdivisions 16 by word lines.

Figure 4C:
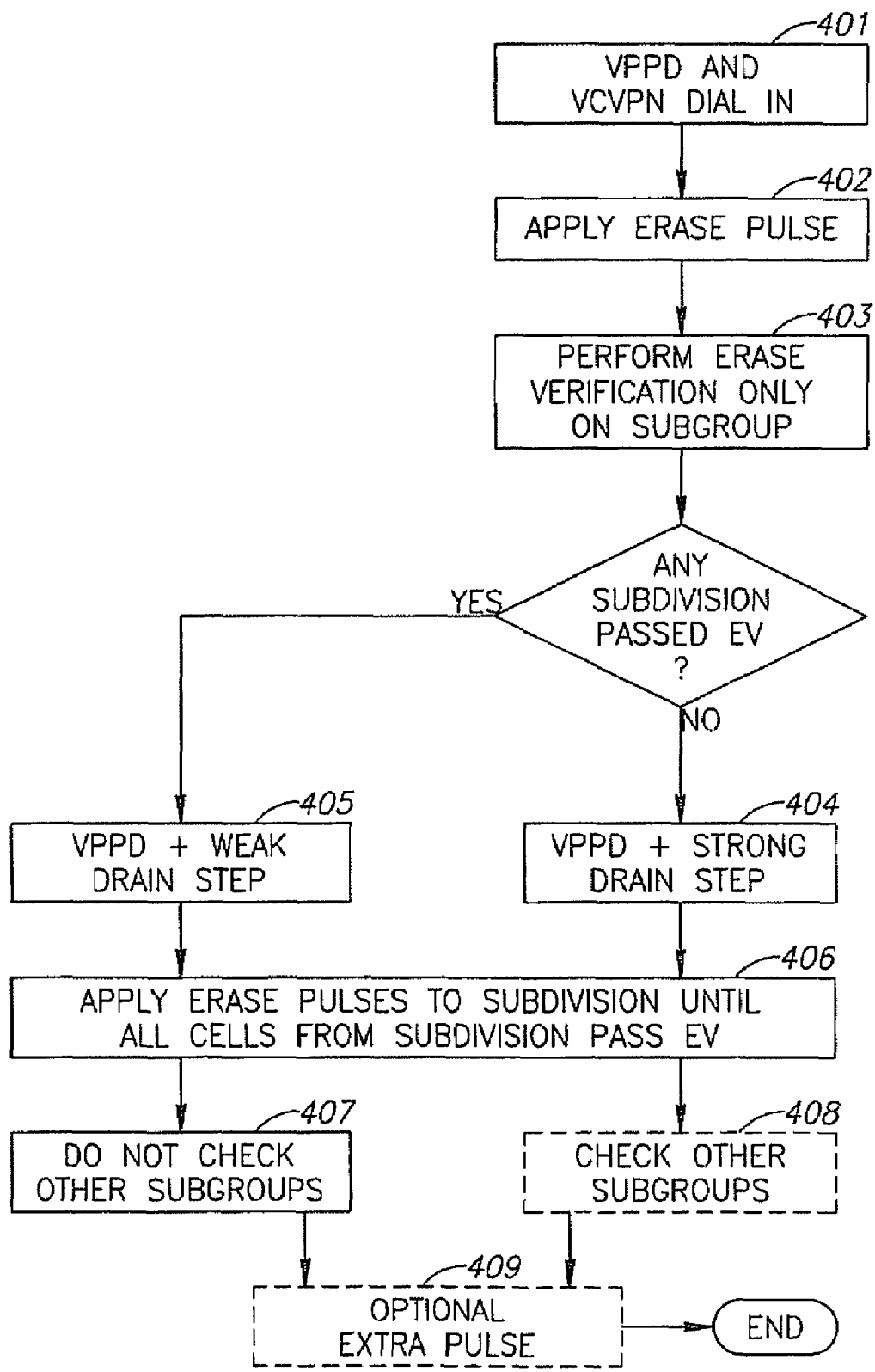
FIG. 4C is a simplified flow diagram of a method for erasing bits of memory cells in a non-volatile memory cell array, in accordance with an embodiment of the present invention.

Reference is now made to FIG. 4C, which illustrates a method for erasing bits of memory cells in a non-volatile memory cell array, in accordance with an embodiment of the present invention.

An erase pulse may be selected for erasing bits of the cells, comprising selecting ("dialing in") a negative gate voltage (Vg or Vcvpn—voltage from a charge pump) and a positive drain voltage (Vppd) (step 401). Typical non-limiting ranges of values may be Vg from −3V to −7V and Vppd from 3V to 7V over a duration of 100-1000 µsec. The erase pulse may then be applied to bits in a cell ensemble (step 402).

In accordance with an embodiment of the present invention, an erase verification operation is not performed on the entire cell ensemble, but rather only on a subgroup of the cell ensemble being erased (step 403). The erase verification operation checks if the threshold voltages (Vt) of the memory cells have been lowered to an erase verify (EV) voltage level or not. This subgroup of the cell ensemble may typically include cells from all subdivisions of the memory cell ensemble, which are defined by the architecture implemented, such as physical array slices, which are connected to the different sense amplifiers (referred to as subdivisions DQ's).

If no subdivision of cells in the verified subgroup of the erased cell ensemble has passed EV, then a new Vppd level may be set (dialed in) with a strong (i.e., large) increment (step 404). If any subdivision passed EV, then a new Vppd level may be set with a weak (i.e., relatively smaller) increment (step 405). Erase pulses may be applied to any subdivision of the cell ensemble until all the cells from the subdivision, which are included in the verified subgroup, are verified as erased (passed EV) (step 406). Once all cells in the subgroup are verified as erased, the erase operation is concluded, without checking other subgroups of the cell ensemble (step 407). Optionally the remaining subgroups may be checked to verify that they are indeed fully erased (step 408). Notwithstanding the above, the cells of the ensemble may receive an extra erase pulse (step 409) at a higher level than the last pulse used to reach full erasure for improving reliability, as taught, for example, in U.S. Pat. No. 6,700,818 and US Patent Applications 20050117395 and 20050058005. Normally this extra erase pulse is administered to groups of cells according to the subdivision of the cell ensemble—for example to the different DQ's, based on the erase pulse level that caused the cells in this DQ to pass EV (or those cells which were actually verified).

Thus the number of verify operations may be reduced and the erase operation may be completed faster. Furthermore, if the subgroup is restricted to a few word lines out of the total number of word lines comprising the erased cell ensemble, the switching time overhead (from 0V to the verification gate voltage and back) may also be substantially reduced.

Figure 5:
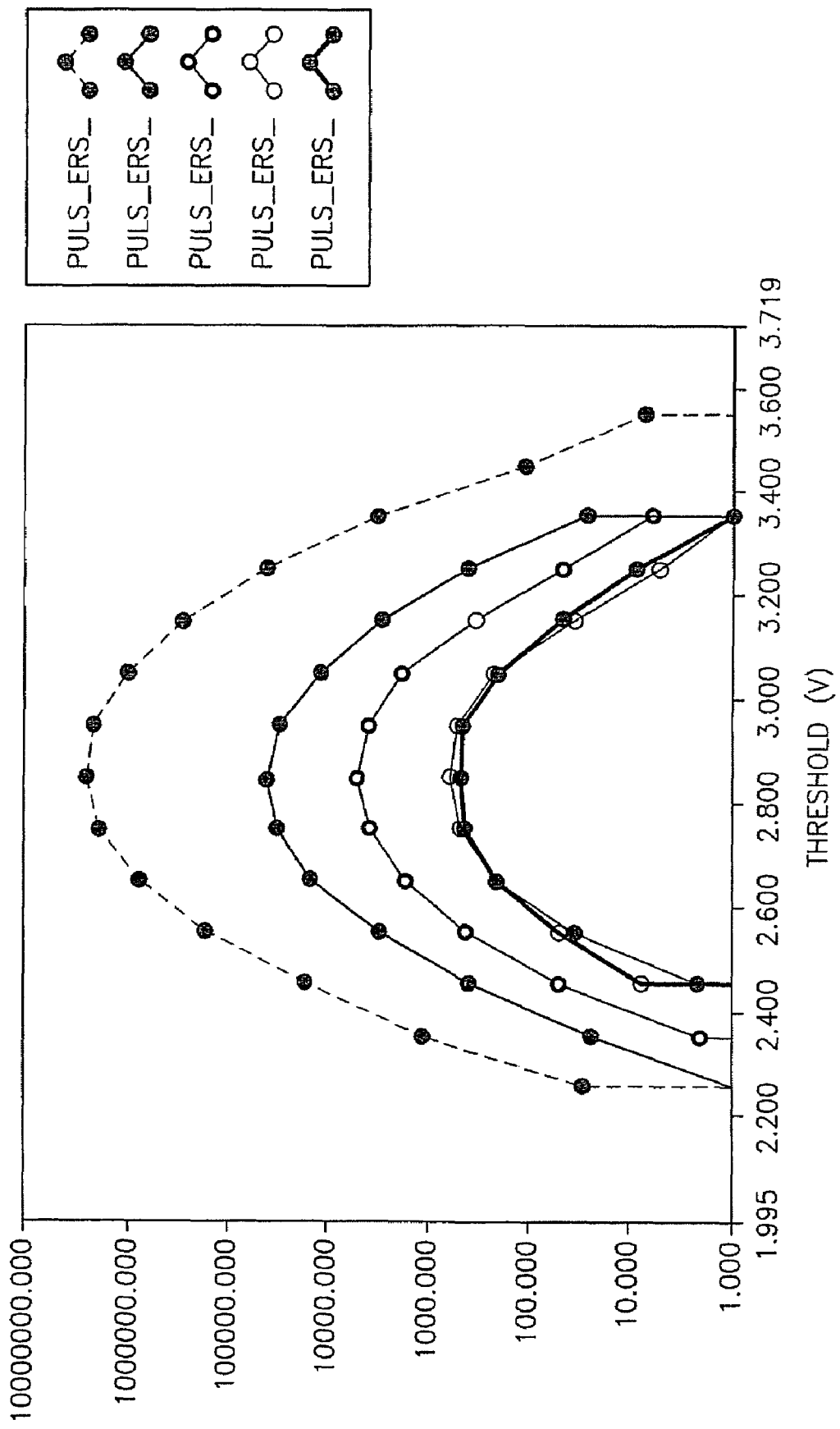
FIG. 5 is a simplified graphical representation of threshold voltage distributions in subgroups of an NROM array as a function of the subgroup size, in accordance with an embodiment of the invention.

The subgroup of the cell ensemble which is erase verified may be alternated between all the subgroups including the cell ensemble, regularly, periodically or randomly from erase operation to erase operation The success of such a partial verification scheme depends on the uniformity of the erased cell ensemble For example, reference is now made to FIG. 5, which illustrates threshold voltage distributions in subgroups of an NROM array as a function of the subgroup size. The example shown in the graph is nearly a uniform case, wherein all cell-to-cell variations are random in nature, and follow a Gaussian distribution. This permits correlating the erase speed of a subgroup (the conditions required to erase the slowest cell in the group) and the erase speed of the full ensemble. That is, this permits performing erase verify on just a subgroup of the cells without having to do EV on all of the cells. However, because EV has not been performed on all of the cells, there is some sort of mismatch between the erase verify that worked for the subgroup as opposed to the rest of the cells, as is now explained.

Figure 6A:
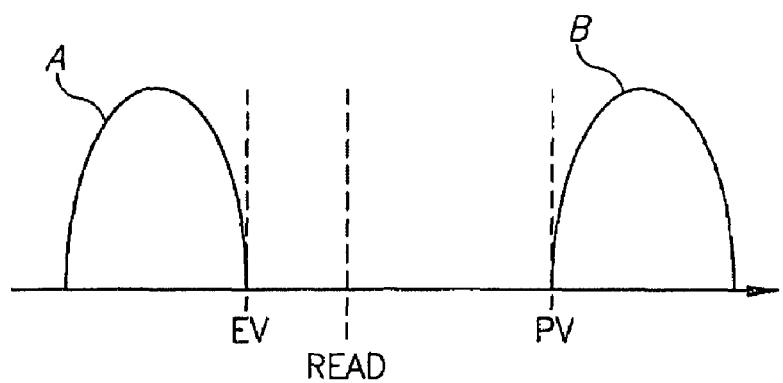
FIG. 6A is a simplified illustration of the statistical distribution of threshold voltages of erased and programmed cells that have been erased and programmed with conventional techniques of the prior art.
Figure 6B:
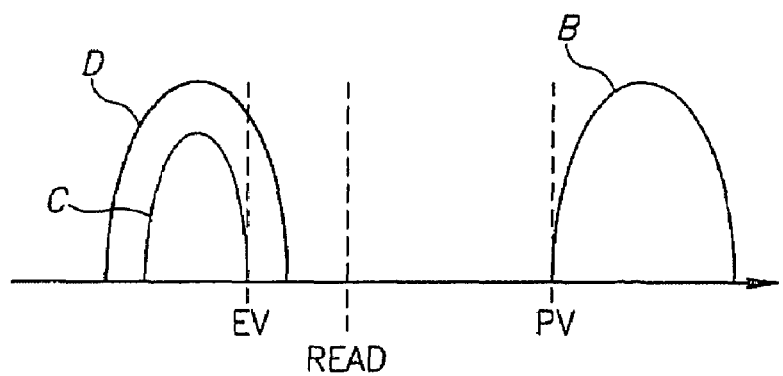
FIG. 6B is a simplified illustration of the statistical distribution of threshold voltages of erased cells that have been erased in accordance with the present invention in accordance with an embodiment of the invention.

Reference is now made additionally to FIGS. 6A and 6B. FIG. 6A illustrates the statistical distribution of threshold voltages of erased and programmed cells that have been erased and programmed with conventional techniques of the prior art. The erased cells may have a Gaussian distribution all of which are below the erase verify level (curve A). Likewise, the programmed cells may have a Gaussian distribution all of which are greater than a program verify level (curve B).

In contrast, FIG. 6B illustrates the statistical distribution of threshold voltages of erased cells that have been erased in accordance with the present invention (curve C). As mentioned before, because EV has not been performed on all of the cells, there is some mismatch between the erase verify that worked for the subgroup as opposed to the rest of the cells. The cause for the mismatch is the statistical nature of the cell threshold voltage distribution. If the amount of bits being erased increases, the threshold voltage distribution becomes wider (i.e., curve C is wider than curve A). This means the probability of single bits being outside the distribution of their surrounding subgroup increases. The mismatch may cause some cells not to reach the erase verify level (the right part of curve C is above the EV level).

Figure 7A:
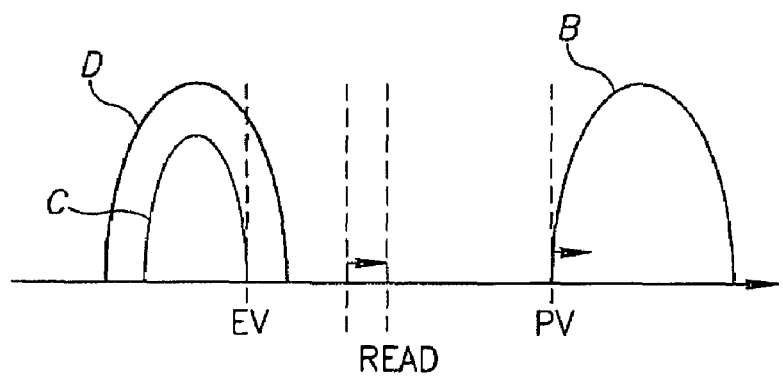
FIG. 7A is a simplified schematic representation of programmed erased cell ensembles, in accordance with an embodiment of the invention, showing the margin loss due to the mismatch of the subgroup with respect to the full cell ensemble.

Reference is now made to FIGS. 7A and 7B. To compensate for the mismatch, an additional margin may be set in the product's operating window between the EV level and the read level. Optionally, the program verify level may be shifted in order not to reduce its margin to the read level. Additionally or alternatively, the extra pulse mechanism (as taught, for example, in U.S. Pat. No. 6,700,818 and US Patent Applications 20050117395 and 20050058005; or other techniques mentioned in the background) may be set to a more aggressive value to insure all cells are below the erase verify level, i.e. fully erased. As another option, as mentioned before, the subgroup may be bunched to a small number of word lines to further reduce the switching overhead.

If fixed variations exist in the memory array, they may be addressed by partitioning the erase operation to subgroups, in order to minimize over erasure of cells. Accordingly, the dynamics of the cells in the array group will be more uniform (such as retention after cycling). Nonetheless, this additional partitioning may require additional erase verify operations, as non-matching subgroups must be verified separately. Yet, even in this case it may not be necessary to verify all cells.

Figure 8:
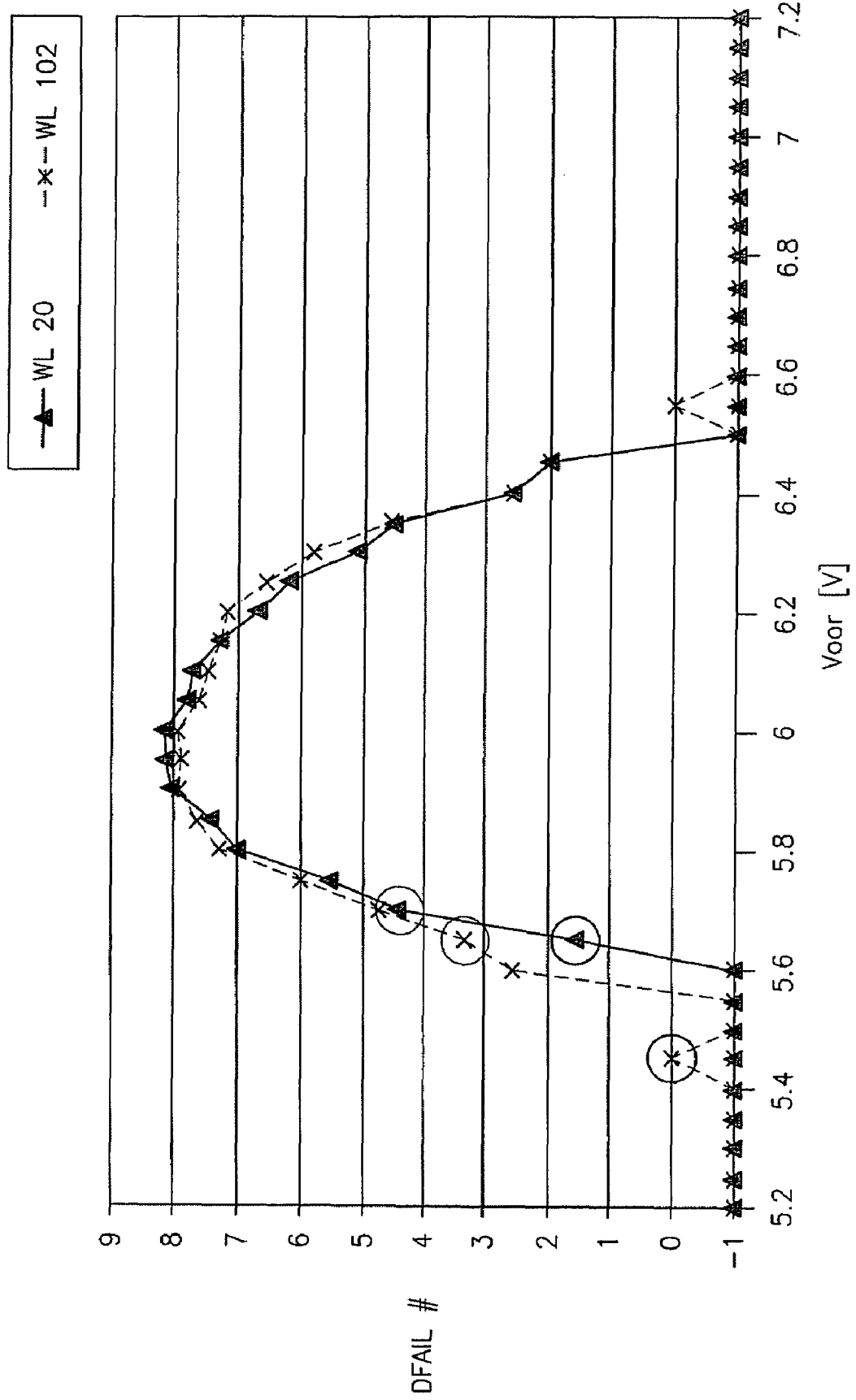
FIG. 8 illustrates simplified graphical representations example of threshold voltage distributions of two subgroups of programmed NROM cells from the same array, with an identical history, in accordance with an embodiment of the invention.

Since the erase verify scheme of the invention is statistical in nature, one may improve its accuracy by disregarding "noisy edges" of the probability distribution Reference is made to FIG. 8, which illustrates threshold voltage distributions of two subgroups of programmed NROM cells from the same array, with an identical history. The distributions show a very high degree of overlap, yet the cells with the lowest threshold voltages, which determine the highest read reference levels that can correctly sense the data content of the cells, are 200 mV apart (at 5.45V and 5.65V). Yet, if the level which causes at least eight bits to be sensed incorrectly (in this case programmed bits which are sensed as being erased) is utilized, two subgroups differ by only 50 mV (5.65V vs. 5.7V). Of course, using eight bits as a trigger mechanism is just an example and does not limit the invention Accordingly, the erase verification mechanism of the present invention may insure that an X number of bits (X>1; e.g., nominally X=8) have passed a set level, thereby substantially reducing the noisy distribution tail, and producing a high probability that the entire cell ensemble has been completely erased (passed EV), even though only a subgroup of cells have been physically verified as doing so.

Although the invention has been described in conjunction with specific embodiments thereof, it is evident that many alternatives, modifications and variations will be apparent to those skilled in the art. Accordingly, it is intended to embrace all such alternatives, modifications and variations.

What is claimed is:

1. A method for erasing memory cells in a memory array, the method comprising: applying an erase pulse to bits of a cell ensemble of a memory cell array; and designating the entire cell ensemble as erase verified once an erase verification operation on a subgroup of the cell ensemble being erased indicates a memory cell threshold voltage (Vt) of each cell in the subgroup has reached an erase verify (EV) voltage level.

2. The method according to claim 1, wherein the entire cell ensemble is verified as being erased only after the subgroup has been verified as being erased.

3. The method according to claim 1, wherein the subgroup is verified as being erased to a level lower than the target EV level, in order to insure that the entire cell ensemble has been erased, even though not all the cells have been verified as such.

4. The method according to claim 1, further comprising minimizing verification time overhead.

5. The method according to claim 1, wherein performing the erase verification operation is done after clustering said subgroup to a subset of word lines to reduce switching overhead.

6. The method according to claim 1, and further comprising increasing a set margin between a read level and the erase verify level.

7. The method according to claim 1, further comprising increasing a set margin between a read level and the erase verify and program verify levels.

8. The method according to claim 1, further comprising applying an erase pulse to a plurality of subgroups of said cell ensemble, but not performing erase verification operations on all of said subgroups.

9. The method according to claim 1, further comprising checking that a number of bits have passed a set level, and producing a high probability that the entire cell ensemble has been passed erase verification, even though only a subgroup of cells have been physically verified as passing erase verification.

10. The method according to claim 9, further including applying extra erase pulses after erase verification has been completed.

11. The method according to claim 9, where the subgroup of the cell ensemble which is erase verified is alternated between all the subgroups comprising the cell ensemble, regularly, periodically or randomly from erase operation to erase operation.

* * * * *